United States Patent [19]
Bacher et al.

[11] Patent Number: 5,543,108
[45] Date of Patent: Aug. 6, 1996

[54] METHOD OF MAKING MICROSTRUCTURED BODIES OF PLASTIC MATERIAL

[75] Inventors: Walter Bacher, Stutensee; Hans Biedermann, Bruchsal; Heinz Dinglreiter, Forst; Helmut Kalb, Eggenstein, all of Germany

[73] Assignees: Forschungzentrym Karlsruhe GmbH, Karlsrahe; Bürkert GmbH, Tugelfingen, both of Germany

[21] Appl. No.: 257,643

[22] Filed: Jun. 9, 1994

Related U.S. Application Data

[63] Continuation-in-part of PCT/EP93/01571, Jun. 21, 1993.

[30] Foreign Application Priority Data

Jul. 11, 1992 [DE] Germany .......................... 42 22 856.5

[51] Int. Cl.⁶ .................................................. B32B 31/00
[52] U.S. Cl. .......................... 264/553; 264/139; 264/162; 264/221; 264/225; 264/226; 264/227; 264/317
[58] Field of Search ................................. 264/553, 139, 264/162, 221, 317, 225, 226, 227; 29/424, 559; 269/7

[56] References Cited

U.S. PATENT DOCUMENTS

| | | | |
|---|---|---|---|
| 2,274,907 | 3/1942 | Madaia | 18/61 |
| 2,663,663 | 12/1953 | Weltman et al. | 154/121 |
| 4,250,127 | 2/1981 | Warren et al. | 264/22 |
| 4,268,946 | 5/1981 | Eisenberg | 29/424 |
| 4,889,666 | 12/1989 | Kawasaki | 264/22 |

*Primary Examiner*—Jan H. Silbaugh
*Assistant Examiner*—Robin S. Gray
*Attorney, Agent, or Firm*—Klaus J. Bach

[57] ABSTRACT

A method of making microstructure bodies of plastic material. A microstructured plate-like base body which is made by any known molding procedure and which has a first side serving as a first reference plane and a second side which has plastic microstructures projecting therefrom is covered at its second side with a material layer that engages the microstructures, whereupon the material layer is machined to provide a second reference surface parallel to the first reference surface and the base body is then machined parallel to the second reference surface to expose the microstructures projecting therefrom and the material layer is finally removed selectively with respect to the plastic material to release the microstructured bodies.

8 Claims, 2 Drawing Sheets

METHOD OF MAKING MICROSTRUCTURED BODIES OF PLASTIC MATERIAL

The present application is a CIP application of International application PCT/EP93/01571, filed Jun. 21, 1993, and claiming priority of German Application P 42 22856.5 of Jul. 11, 1992.

BACKGROUND OF THE INVENTION

The invention relates to a method of making microstructured bodies of plastic material from a plate-like plastic material which has the microstructured bodies formed thereon.

DE 40 10669 C1 discloses a method of making molds from which microstructured plate-like bodies can be formed by electrodeposition, wherein the structure base forms a continuous surface covered with a layer of an electrically conductive material made from a layer of a thermoplastic material which is coated with a film of an electrically conductive material, and wherein a micro structured molding tool is impressed into the thermoplastic material through the electrically conductive coating at a temperature which is above the softening temperature of the thermoplastic material and the tool and the thermoplastic material are then cooled to a temperature which is below the softening temperature of the thermoplastic material, whereupon the tool is removed. The negative molds can subsequently be formed therefrom by electrodeposition whereby, for example, grid-like microstructured plate-like bodies (net structures or similar shapes) of metal can be made. Microstructured bodies of plastic cannot be manufactured by this process (disregarding the negative mold). Furthermore, the structure base in the microdepressions must form a continuous surface with this method. During the following electrodeposition the microdepressions are Filled with a metal whereby the structure base of the microdepressions in the negative molds becomes the Front surface of the microstructured positive-shape bodies obtained by the galvanic Forming or molding process. Consequently, the known method provides for the making of a single microstructured body but not for a plurality of microstructured bodies.

It is the principal object of the present invention to provide a method by which microstructured bodies of plastic can be made. It should also permit to make several or a plurality of microstructured bodies.

SUMMARY OF THE INVENTION

In a method of making microstructure bodies of plastic material a microstructured plate-like base body which is made by any known molding procedure and which has a first side serving as a first reference plane and a second side which has plastic microstructures projecting therefrom is covered at its second side with a material layer that engages the microstructures whereupon the material layer is machined to provide a second reference surface parallel to the first reference surface and the base body is then machined parallel to the second reference surface to expose the microstructures projecting therefrom and the material layer is finally removed selectively with respect to the plastic material to release the microstructured bodies.

The final products of the method according to the invention are, for example, microstructured bodies in the form of net or lattice structures if the microstructured bodies on the plate-like bases are a continuous structure such as a honeycomb structure or a multitude of small microstructured bodies of any shape if the microstructured bodies form independent coherent structures which are separate from one another. The method according to the invention accordingly permits the manufacture not only of a microstructured body of plastic material but also of several or of many small microstructured bodies at a time without requiring different method steps. The small microstructured bodies may all have the same or they may have different shapes. The shape of the final product is determined only by the shape and the interconnections of the microstructured bodies on the base.

BRIEF DESCRIPTION OF THE DRAWINGS

FIGS. 3 to 9 show the method steps for making microstructured bodies with the base body of FIG. 2a.

DESCRIPTION OF THE PREFERRED EMBODIMENT

Figure 2A:
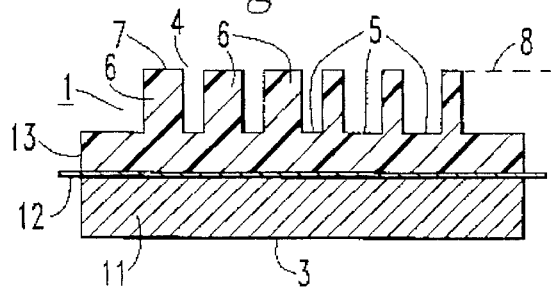
FIGS. 2a and 2b show two base bodies that can be used for the method according to the invention.
Figure 2B:
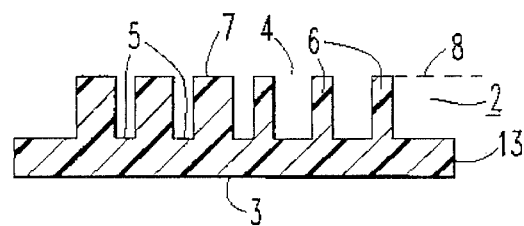
Figure 3:
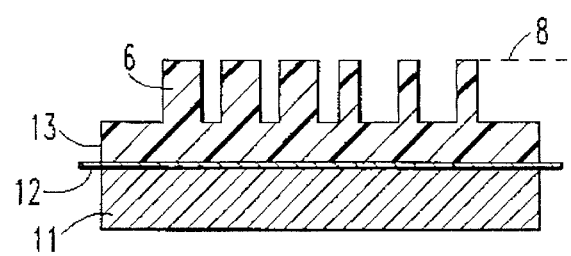

As shown in FIGS. 2a and 2b a plate-like base body 1, 2 is provided whose one side 3 represents a first reference surface and which has a second side 4 which is microstructured in such a way that microstructure bodies 6 of plastic material project from a structure base 5. As reference, surfaces accurately planed, for example, grounded surfaces, may be employed. The front surfaces 7 of the microstructure bodies which extend farthest from the structure base 5 are preferably disposed on a common plane 6. The shape of the microstructure bodies 6 is not important. The microstructure bodies 6 may be rectangular in cross-section, pyramidical or frustoconical or stepped. As already mentioned, the microstructure bodies 6 or the front surfaces 7 may be a continuous structure or discrete "islands" in which the microstructures are continuous only within a discrete array. The various "islands" may be structured identically or they may be structured in different ways. In the first case a multitude of the same final products are obtained; the second case leads to several different end products. The reference surface 3 of the base bodies 1, 2 is cut to be plane with such accuracy that the subsequent material treatment process steps can be performed all with reference to the reference surface 3. Furthermore, it is important that the structure base 5 is exactly parallel to the reference surface 3.

Figure 1:
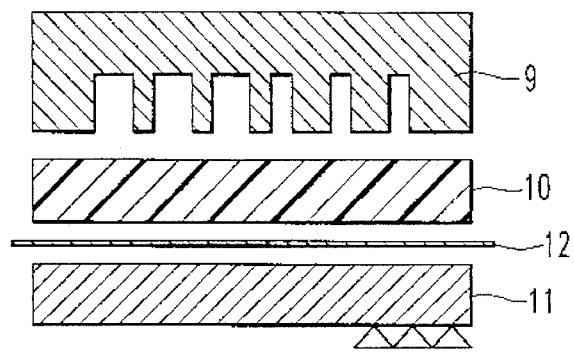
FIG. 1 is a schematic representation of the method of making a base body.

The base bodies can be manufactured by various methods which are known per se (see FIG. 1). For example, a molding tool 9 can be applied to a plastic material layer 10. In some methods the molding step is supported by a metal stamp 11. Preferably a separation foil 12 is placed between the metal stamp 11 and the plastic material layer.

1. In a vacuum forming process a thermoplastic material layer is pressed onto a molding tool in exactly parallel relationship under a reduced pressure of 1 to 10 mbar. The forming temperature is above the glass transition temperature for amorphous polymers; for partially crystallized polymers it is in the range of the crystellite melting point. To facilitate the molding procedure a metal stamp of suitable size and provided with grooves may be disposed on the side of the thermoplastic material opposite the molding tool so that the pulling forces needed for the mold removal step can be applied. Upon compression, the thermoplastic material firmly enters the grooves and firmly engages the metal stamp. The backside of the metal stamp provides the reference surface for the further processing steps and therefore it must be machined accurately. In order to facilitate later separation of the metal stamp from the structured thermoplastic material layer a separating foil such as a PTFE (polytetrafluoroethylene) foil is disposed between the stamp and the thermoplastic material. Alternatively, a separating agent may be sprayed onto the metal stamp. With some thermoplastic materials which have low intrinsic friction properties such as PVDF (polyvinyl-idenfluoride) such a separation layer is not required. After stamping of the thermoplastic material into the mold, the mold and the thermoplastic material are cooled below the softening temperature. The base body is then removed from the mold by means of a metal stamp. As shown in FIG. 2a the base body 1 consists of a microstructured plastic material layer 13 carrying the microstructure bodies 6 and the metal stamp 11 whose exposed surface 3 represents the reference surface.

2. Another method of making the base body resides in the reaction casting process. In this process a liquid resin is poured into a cavity in the molding tool with the metal stamp described earlier which is mounted thereon in exactly parallel relationship. The resin is subsequently polymerized within the cavity. Because of the firm engagement between the polymerized resin and the stamp the metal stamp can be used as described above to assist in the removal of the microstructures, that is, of the base body from the mold. In order to facilitate later removal of the base body from the stamp it is advisable to apply to the stamp a PTFE coating. Also this procedure provides for a base body of plastic material 13, 6 with the metal stamp 11, whose exposed surface 3 represents the reference surface.

3a. The base body can also be made by way of the injection molding process. In this process a liquid thermoplastic material is injected under high pressure into a molding structure consisting of the mold and a plate disposed parallel to the mold surface. The plate consists preferably of metal, for example, stainless steel. Within the mold the thermoplastic material is cooled below its softening temperature and it is finally removed from the mold. In order to provide the forces needed for the removal of the formed bodies from the mold, there are ejector pins for pushing the formed bodies out of the mold. With this process—contrary to the processes described under 1 and 2—a plate-like plastic material structure as shown in FIG. 2b with microstructured surfaces and a plane backside 3 which represents the reference surface is obtained.

3b. In an alternative injection molding process a metal stamp as described under 2 is utilized in place of the flat plate. Then it is possible to apply the necessary forces for removal of the formed body from the mold by means of the metal stamp with which the injected plastic material is firmly engaged. This alternative process provides a base body corresponding to that obtained by the processes described under 1 and 2.

With all methods, care has to be taken that a reference surface 3 is obtained which is accurately parallel to the plane formed by the structure base 5. This reference surface 3 is formed either by the accurately cut underside of a metal stamp 11 (methods 1, 2 and 3b) or by the molding of an accurately flat plate (method 3a). The parallel arrangement of the reference surface 3 and the plane of the structure base is achieved by positioning of the molding tool 9 accurately parallel with respect to the reference surface.

With the base body used in the method according to the invention the height of the microstructure 6 above the structure base 5 may be between 1 and 1000 μm preferably between 1 and 500 μm. The microstructure bodies 6 consist of an already referred to plastic material (PVDF, etc.) or of polymethylmethacrylate (PMMA). The thickness of the material layer 13 between the structure base 5 and the first reference surface 3 (base body according to process 3a) or between the structure base 5 and the interface between the plastic material layer 13 and the metal stamp 11 (base body according to process 1, 2 and 3b) should be several millimeters for reason of mechanical stability. This layer 13 consists normally of the same plastic material of which the microstructure body consists. The thickness of the metal stamp 11 is 4 to 10 mm, preferably at least 6 mm. For the metal stamp any easily workable inert metal is suitable. Stainless steel is the preferred metal.

Figure 4:
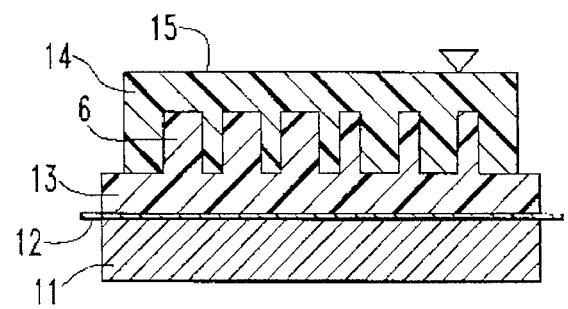
Figure 5:
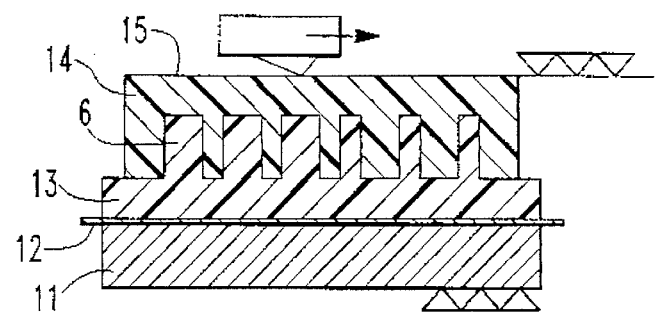
Figure 6:
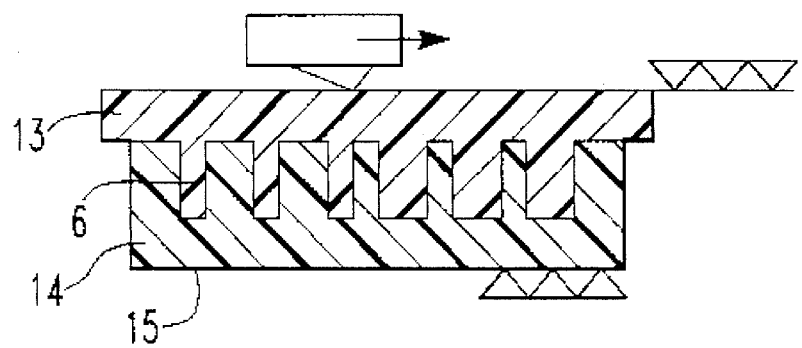

As shown in FIG. 4 a material layer is deposited on the base body 1, 2 in accordance with the first method step of the method according to the invention, for example, by one of the well-known thick-film processes. The thickness of the layer is preferably 2 to 4 mm for the base body according to FIG. 2b and more than 5 mm for the base body according to FIG. 2a, in order to achieve sufficient mechanical stability of the material layer 14 including the microstructure body 6 embedded therein to prevent its bending after the metal stamp 11 has been removed in a subsequent method step.

As layer materials, basically all those materials are suitable which, on one hand, adhere to the plastic material of the microstructure body 6 on the base body 1, 2 and, on the other hand, can be selectively removed from this plastic material body 6, for example, by dissolution. Also a good mechanical workability of the material is advantageous.

However, it is in accordance with the invention also possible to utilize for deposition materials which cannot be selectively removed from the plastic material microstructure bodies; it is possible, for example, to use the same plastic material of which the microstructure body 6 consists. In this case the microstructure bodies 6 must be provided with a protection or marker coating (in the Figures this is shown by heavy lines). As such coatings thin layers of gold, titanium or a photo lacquer may be utilized which can be selectively removed from the plastic material. The microstructure bodies are covered with such a coating so that the material can be removed in a subsequent method step without damaging the microstructure bodies 6.

Preferably, the marker coating is also applied if the plastic material of which the microstructure body 6 consists and the material layer 14 are optically not clearly distinctive. Then the subsequent machining of the base body is facilitated since the marker coating indicates the interface area between the plastic material and the cover material layer 14. If the cover material provided does not adhere sufficiently to the plastic material of the microstructure bodies, the marker layer may at the same time serve as a retaining structure. For this purpose, generally chromium is quite suitable.

The protection or marker coating is applied preferably with a thickness of 0.01 to 10 μm. But as will be explained later, a substantially thicker protection or marker coating of 10 μm to 1000 μm may be advantageous. Suitable methods for applying the marker coating are, for example, sputter deposition, vapor deposition, spraying and immersion coating.

In many cases it may be advantageous to machine the microstructure bodies 6 on the base bodies 1, 2 before the material layer 14 is applied. In those cases the procedure of applying the material layer is changed. The structure base 5 of the base bodies is first built up only to some degree, that is, up to about half the height of the front surfaces 7. Then the front surfaces are machined so as to be parallel to the reference surface 3 with the thin layer of material 14 disposed thereon. Suitable machining process are microform cutting, cutting with diamond cutting tools, grinding or polishing processes. After machining, the thickness of the material layer 14 is increased by applying additional material. However this is not necessary if, as in the method described under 3a, the base body is not provided with a metal stamp as shown in FIG. 2b.

In the following method step the exposed surface 15 of the material layer 14, which is disposed on the microstructure bodies 6, is machined flat and parallel to the reference surface 3. In this manner a second reference surface is created on which the subsequent method steps are based. The second reference surface is exactly parallel to the first reference surface.

If the base body (as shown in FIG. 2a) is provided with a metal stamp 11, the metal stamp 11 is removed in the next method step. For this purpose the metal stamp 11 is, for example, firmly held in position and the compound structure of plastic material 6, 13 and the material layer is pushed off the stamp in a direction parallel to the grooves in the stamp 11 (which are not shown in the Figures). For this step it is advantageous if the metal stamp is surface-coated or provided with a separation foil 12 because static and sliding friction between the metal stamp and plastic material are substantially reduced in this manner. If a separation foil has been used the foil can be removed simply by pulling it off.

With the surface machining of the material layer 14 a second, new reference surface 15 has been created which is parallel to the first reference surface. The new reference surface is used as basis for further machining.

Based on the new reference surface the base body can now be machined (after removal of the metal stamp if applicable) at its one side 3 until the structure base 5 is exposed. After this machining step only the microstructure bodies 6 remain of the base body 1, 2. Finally the material 14 and, if applicable, the protection or marker coating is selectively removed, then the earlier described final products 16 of the method are present.

Figure 7:
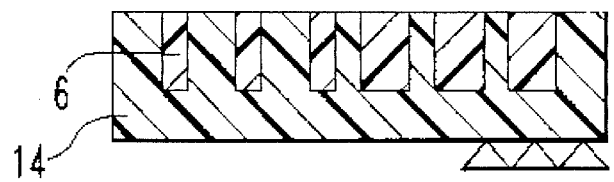
Figure 8:
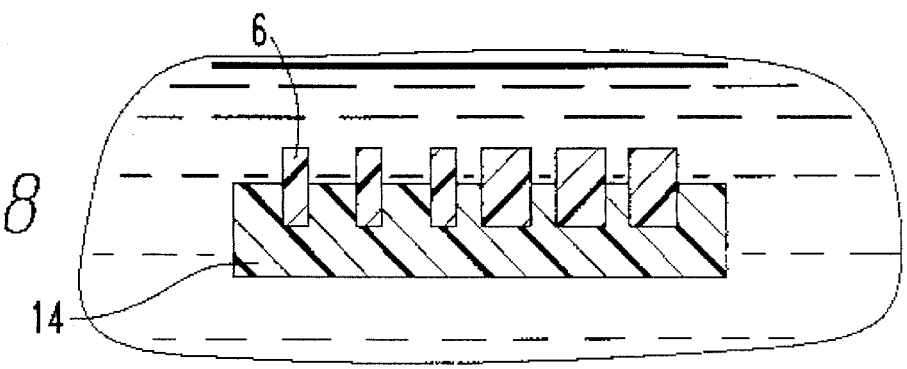
Figure 9:
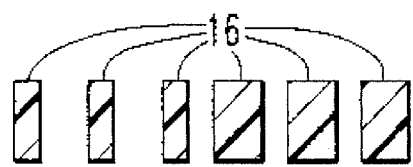

The selective removal of the material 14 is achieved preferably by dissolution of the material 14 off the plastic material of the microstructure bodies 6. Alternatively the surface where the microstructure bodies are exposed (FIG. 7), can be covered with another protection or marker coating before the material 14 is dissolved. This and the protection and marker coating applied earlier prevent that also the microstructure bodies 6 are attacked by the solution. If necessary the protection and marker coating can be dissolved subsequently. The final product 16 can be filtered out of the solution bath.

If, as mentioned earlier, a thick protection and marker coating was applied such a thick coating can also be dissolved selectively with regard to the material layer 14 and the plastic material 6, 13. Then the final products 16 remain free in the cavities of material layer from which they can be easily removed.

In the method according to the invention the microstructure bodies obtained by forming them from a microstructured molding tool directly are the final product of the method. Another copying step is not necessary.

The method according to the invention permits to manufacture end products from plastic materials which could not be utilized so far. This is particularly important with regard to final products of thermoplastic materials such as PVDF. PVDF which has a high chemical and thermal resistance and good intrinsic and good slide capabilities, that is, low friction. Since it is chemically inert it can be used in medicine and food processing technology.

A further advantage of the method according to the invention is that, in combination with the method described in DE 41 26877 C1, positive as well as negative molds can be made with a single microstructured tool.

The invention is described below with a number of examplary methods.

EXAMPLE 1

With commercially available raw plastic material (PVDF) a base body was made by the stamping process described above. For this purpose the raw plastic material was placed onto a metal stamp of stainless steel and, at a temperature of about 185° C. pressed into a microstructured molding tool. At about 125° C. the plastic material was removed from the molding tool by means of the metal stamp. The use of a separation foil between metal stamp and plastic material is not necessary with PVDF since PVDF has good intrinsic sliding properties.

The base body has a microstructured area of about 1200 mm$^2$. Altogether there were 47 independent microstructure components on the base body which did not have a continuous front face and these microstructure bodies in turn are also microstructured. Consequently from such a base body, for example, 47 final product pieces can be manufactured in parallel processing at the same time.

The microstructure bodies have a height of about 500 μm; their front faces are 10 to 200 μm wide. The aspect ratio is 25. The distance between the distinct microstructure bodies from one another is variable.

The microstructured side of this base body was spray-dusted with a very thin layer of gold (about 20 mm).

Subsequently, the gold coated microstructure bodies were covered with a PMMA layer of about 4 mm which was polymerized. The PMMA layer was handled at room temperature. The curing process was accelerated by heating to about 100° C. The surface of PMMA layer which was polymerized onto the microstructure bodies was cut by a fine milling tool parallel to the underside of the metal stamp which was the first reference surface.

Subsequently, the metal stamp was removed and the then exposed layer was machined. Now, the plane surface of the PMMA layer served as a reference surface for this procedure step, The PVDF was cut down to the gold marker coating fist by a milling cutter in a rough cutting step and then with a polishing quality milling cutter so that the single microstructure bodies embedded and supported in the PMMA material were exposed.

Then the PMMA layer which was polymerized onto the microstructure bodies was dissolved selectively with regard to the PVDF microstructure bodies in ethylacetate at about 80° C. in about 30 minutes. Finally the marker layer of gold was etched off the microstructure bodies by aqua regia.

EXAMPLE 2

The procedure of Example 1 was repeated wherein however a base body of PMMA was used. The microstructured side of this base body also was-coated by a gold layer. The material placed onto the gold coating was again PMMA. Before the dissolution of the PMMA material from the cavities of the microstructures however the exposed surfaces of the microstructure bodies were protected by another gold coating.

EXAMPLE 3

The procedure according to Example 2 was repeated but, instead of a gold marker coating, a copper coating of about 50 nm thickness was applied. The copper coating was then increased to a thickness of about 50 µm by electrodeposition of copper and PMMA was then poured onto the copper coating. At the end the copper coating was removed selectively with respect to the adjacent PMMA layers by a solvent of ammonium alcaline chloride, whereupon the microstructured final products could be removed from the embedment layer.

What is claimed is:

1. A method of making microstructure bodies of plastic material comprising the steps of:
    a) providing a base body having a first side representing a first reference plane and a second side which is microstructured such that plastic material microstructures project from a structure base of said base body, which structure base extends parallel to said reference plane;
    b) coating said base body at said second side thereof with a marker layer;
    c) placing a layer of a second material onto said marker layer on said second side of said base body such that said second material layer has an exposed surface;
    d) machining the exposed surface of said second material layer overlaying the base body to provide a second reference plane parallel to said first reference plane;
    e) machining said first side of said base body parallel to said second reference plane to remove a portion of said base body at least up to said structure base; and
    f) removing said second material selectively with respect to said plastic material by dissolving said marker layer and said second material layer to thereby form microstructure bodies of plastic material.

2. A method according to claim 1, wherein said base body consists of said plastic material.

3. A method according to claim 1, wherein said base body is a compound structure of said plastic material with a metal plate wherein said first side consists of said metal plate and said second side consists of said plastic material.

4. A method according to claim 1, wherein said base body, having said second side which is microstructured, is molded in a microstructured molding tool using a molding method selected from the group consisting of vacuum molding, reaction molding and injection molding.

5. A method of making microstructure bodies of plastic material comprising the steps of:
    a) providing a base body having a first side representing a first reference plane and a second side which is microstructured such that plastic material microstructures project from a structure base of said base body, which structure base extends parallel to said reference plane;
    b) forming a material layer on said second side by placing a first portion of a second material onto said microstructured side of said base body up to a level which is not higher than said microstructures, thereby engaging said microstructures;
    c) mechanically machining the microstructures on said second side of said base body to provide a machined surface which exposes evenly cut surfaces of said microstructures,
    d) overlying an additional portion of said second material onto said second side of said base body and the machined surface which exposes said evenly cut surfaces of said microstructures,
    e) machining said additional portion of said second material layer overlaying the base body to provide a second reference plane parallel to said first reference plane;
    f) machining said first side of said base body parallel to said second reference plane to remove a portion of said base body at least up to said structure base; and
    g) removing said second material selectively with respect to said plastic material to thereby form said microstructure bodies of plastic material.

6. A method according to claim 5, wherein said base body consists of said plastic material.

7. A method according to claim 5, wherein said base body is a compound structure of said plastic material with a metal plate wherein said first side consists of said metal plate and said second side consists of said plastic material.

8. A method according to claim 5, wherein said base body, having said second side which is microstructured, is molded in a microstructured molding tool using a molding method selected from the group consisting of vacuum molding, reaction molding and injection molding.

\* \* \* \* \*